United States Patent [19]

Seki et al.

[11] Patent Number: 5,131,972
[45] Date of Patent: Jul. 21, 1992

[54] FILM GUIDE DEVICE FOR A FILM BONDING APPARATUS

[75] Inventors: Mitsuhiro Seki, Tokyo; Shigeo Sumi, Saitama; Fumio Hamamura, Kanagawa, all of Japan

[73] Assignee: Somar Corporation, Tokyo, Japan

[21] Appl. No.: 532,418

[22] Filed: Jun. 4, 1990

[30] Foreign Application Priority Data

Jun. 4, 1989 [JP] Japan .................. 1-141967

[51] Int. Cl.⁵ .......................................... B32B 31/04
[52] U.S. Cl. .................................. 156/552; 156/517; 156/521; 156/522
[58] Field of Search ............... 156/521, 517, 522, 552

[56] References Cited

U.S. PATENT DOCUMENTS

| | | | |
|---|---|---|---|
| 3,390,843 | 7/1968 | Young | 242/75.43 |
| 4,025,380 | 5/1977 | Bernardo | 156/355 |
| 4,585,509 | 4/1986 | Obayashi | 156/497 |
| 4,659,419 | 4/1987 | Miyake | 156/522 |

FOREIGN PATENT DOCUMENTS

| | | |
|---|---|---|
| 0263273 | 4/1988 | European Pat. Off. . |
| 2624327 | 12/1977 | Fed. Rep. of Germany . |
| 2204305 | 11/1988 | United Kingdom . |

*Primary Examiner*—Caleb Weston
*Attorney, Agent, or Firm*—Sughrue, Mion, Zinn, Macpeak & Seas

[57] ABSTRACT

A film guide device for film bonding in which a movable guide roller support and guides the film and swing roller arms prevent the slackening of the film while the film is being fed. Also, a driving action of a rotation-drive source, which controls the movement of the movable guide roller support arms, is synchronized with the braking of the film supply role and the movement of the leading edge of the film towards the bonding surface. This device prevents longitudinal wrinkles in the film, misplacement on the bonding surface, and excessive tension on the film.

15 Claims, 6 Drawing Sheets

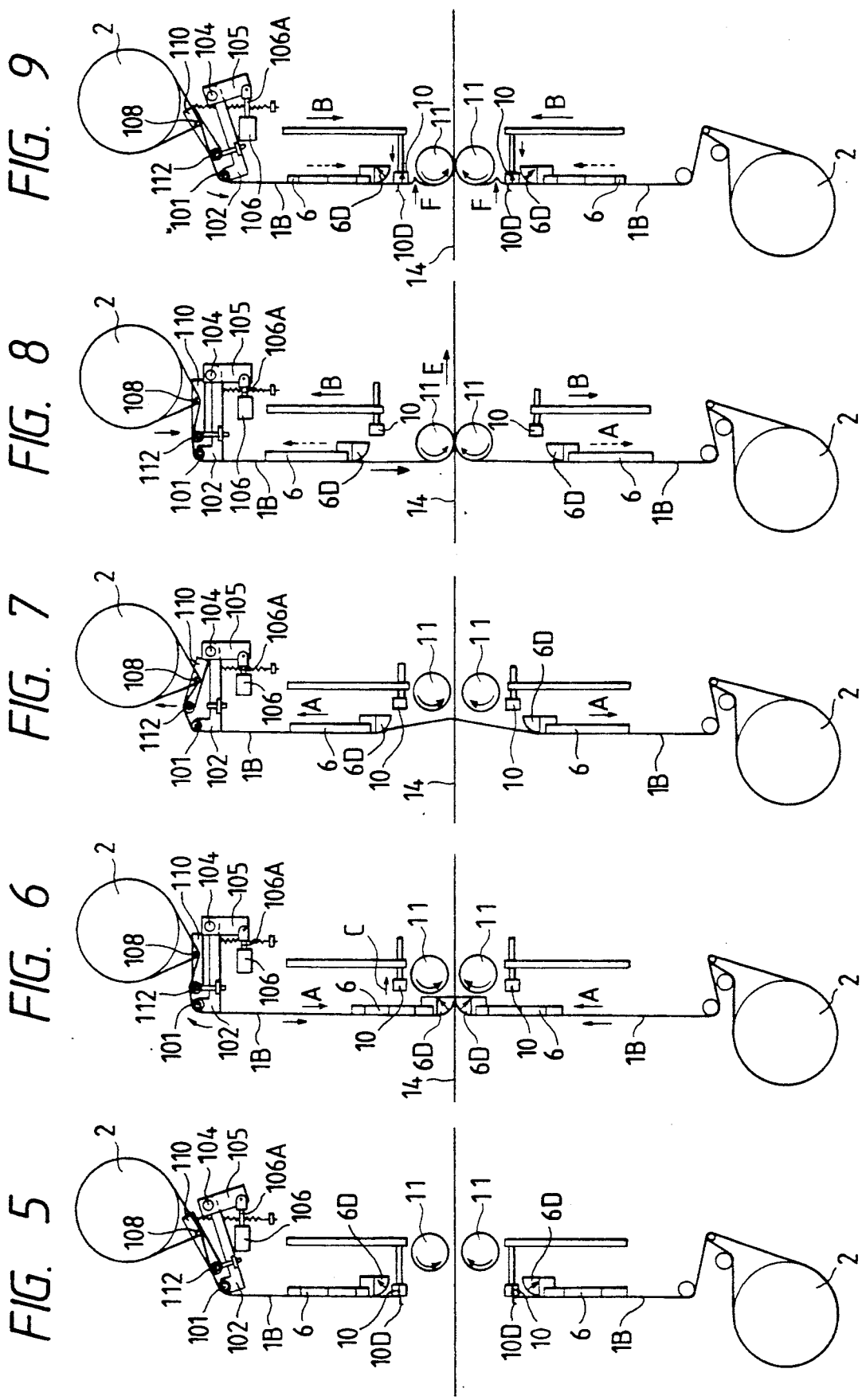

FILM GUIDE DEVICE FOR A FILM BONDING APPARATUS

BACKGROUND OF THE INVENTION

This invention relates to a film guide device for film bonding, and more particularly to a film bonding apparatus for laminating under heat and pressure a laminate film, composed of a photosensitive resin layer and a light-transmitting resin film, onto a board for printed wiring.

DESCRIPTION OF THE PRIOR ART

A film bonding apparatus in which a laminate film is continuously cut to a length corresponding to the length of printed boards, transferred by a roller conveyor or the like, and at the same time is bonded to the printed wiring boards is disclosed in Japanese Laid-Open (Kokai) Patent Application No. 26555/85. In the above Japanese Laid-Open Patent Application No. 26555/85, as shown in FIG. 10 (corresponding to FIG. 3 of this cited publication), a film tension-relieving device is taught comprised of a first arm 212 with a roller 214 at one end and a second arm 213 pivotally connected at one end to an intermediate portion of the first arm 212. The first arm 212 is rotatable about a horizontal axis and serves to guide and support a film. The second arm 213 is connected to the first arm 212 by a first horizontal pin member 215. The other end of the second arm 213 is pivotally connected to a fixed member by a second horizontal pin member 216. The first arm 212 is subjected to a moment slightly greater than the oppositely-acting moment produced by the resultant force of the weight of the film pressing on the roller 214 and the weight of the roller 214.

Another example of a film bonding apparatus is described in Japanese Laid-Open Patent Application No. 200991/88. The apparatus transfers the film by a roller conveyor or the like, initially bonds the leading end of the film to the printed wiring board, and produces a slack in the film necessary for the cutting of the film. After the initial bonding, the suction-holding of the film by an initial bonding member is released, the initial bonding member is moved away from the board, the film is again suction-held by the initial bonding member, and then the initial bonding member is rapidly moved toward the board to rapidly feed the film from a film supply roll. The film supply roll is rotated by inertia, which results in an excessive amount of the film being fed from the film supply roll. To prevent this, a strong braking action is used.

However, in the above conventional film tension-relieving device, the rotatable roller for supporting and guiding the film is positioned rearwardly of a suction surface of the initial bonding member for suction-holding the leading end of the film 1. Therefore, during the time when the initial bonding member is moved upward, after finishing the initial bonding of the leading end of the film to the board and then releasing the suction-holding of the film 1, there is a risk that the film 1 may be damaged by the suction surface of the initial bonding member.

Also, during and after the upward movement of the initial bonding member, after finishing the initial bonding of the leading end of the film to the board and then releasing the suction-holding of the film 1, the position of the rotatable roller for supporting and guiding the film 1 is unstable. Therefore, when the film is to be again suction-held by the initial bonding member, wrinkles may be produced in the film 1.

Further, in the latter conventional film bonding method, when the initial bonding member is rapidly moved toward the board to rapidly feed the film and produce a slack in the film, as described above, a strong braking action is used to prevent the film from being excessively fed by the inertia of the film roller. Therefore, when the film is to be bonded to the board, the continuous film to be fed is subjected to an excessive tension. As a result, the leading end of the film may be incorrectly positioned during initial bonding.

A further problem in the conventional film bonding method is that the excessive tension may produce longitudinal wrinkles in the film which remain on the surface of the board when the film is bonded to its surface.

The present invention has been made in order to overcome the above stated problems.

An object of this invention is to provide a means for preventing the position of the initial bonding of the film leading end from being out of place.

Another object of the invention is to provide a means for preventing longitudinal wrinkles from developing in the film.

A further object of the invention is to provide a means by which the film is not subjected to an excessive tension, even when a strong braking action is applied, to prevent excessive film from being fed from a continuous supply.

SUMMARY OF THE INVENTION

An important aspect of the present invention for achieving the above objects, is a film guide device having a movable guide roller for supporting and guiding a film opposite ends of the movable guide roller being supported respectively by one end of movable guide roller support arms. The other ends of the movable guide roller support arms are fixedly secured to a rotation-transmitting bar which is rotatably mounted at its opposite ends on support members. Also, a rotation-drive source for example, a pivotally connected movable member of a cylinder is connected to the rotation-transmitting bar.

According to another feature of the invention, opposite ends of a separate roller are borne respectively by support members. Swing roller support arms are mounted at an intermediate positions on the opposite ends of the separate roller. The other ends of the swing roller support arms are pivotally mounted in the vicinity of the rotation-transmitting bar for said movable guide roller support arms, and are pulled by a spring in the vicinity of the rotation-transmitting bar for the movable guide roller support arms. Also, the opposite ends of the swing roller are supported by the other ends of the swing roller support arms, respectively.

According to a further feature of the invention, a swing roller stopper is provided in the vicinity of that portion of the swing roller supported by the swing roller support arm.

According to a further feature of the invention, a tension is applied to the film that is fed to the movable guide roller in the direction of the width of said film.

In the operation of the present invention, the leading end of the film is initially bonded to each of the separate boards conveyed by a conveyor. In this condition, the movable member of the cylinder is retracted to bring the movable guide roller support arms into a horizontal position so as to apply a tension to the film. Then, the suction-holding of the film is released and the initial-bonding member is moved away from the board. When the film bonding has not yet been started, a tension is applied to the film by the swing roller so that the film to be fed is not slackened. When the film bonding is started, the film is subject to a tension so that the swing roller is moved downward. Simultaneously the film is held on the initial-bonding member by suction as the initial bonding member is rapidly moved toward the board, thereby slackening the film. Then, the film is cut to a predetermined length. As a result of the extending of the movable member of the cylinder, the movement of the movable guide roller is synchronized with the rapid movement of the initial-bonding member toward the board. Therefore, even if a strong braking force is applied to prevent the film from being excessively fed from the supply roll upon rotation of the supply roll by inertia when the initial-bonding member is rapidly moved toward the board, an excessive tension is not applied to the continuous laminate film.

The above and other objects and novel features of the present invention will become manifest upon making reference to the description of this specification and accompanying drawings.

DESCRIPTION OF THE DRAWINGS

FIGS. 5 to 9 are views explanatory of the laminating operation effected by the film bonding apparatus of FIG. 4;

DESCRIPTION OF THE PREFERRED EMBODIMENTS

Figure 1:
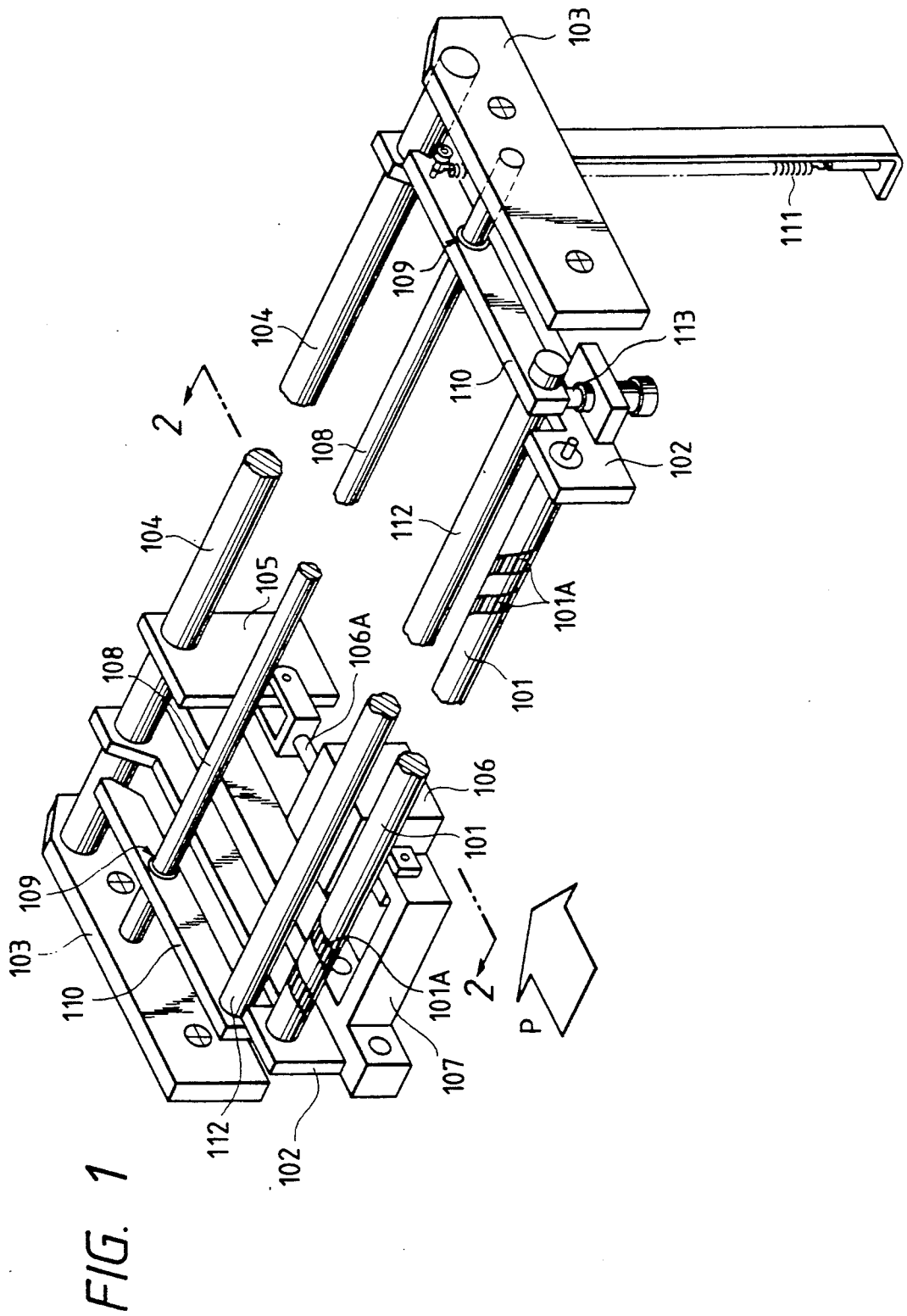
FIG. 1 is a perspective view of a basic construction of a film guide device for film bonding, provided according to the present invention.
Figure 2:
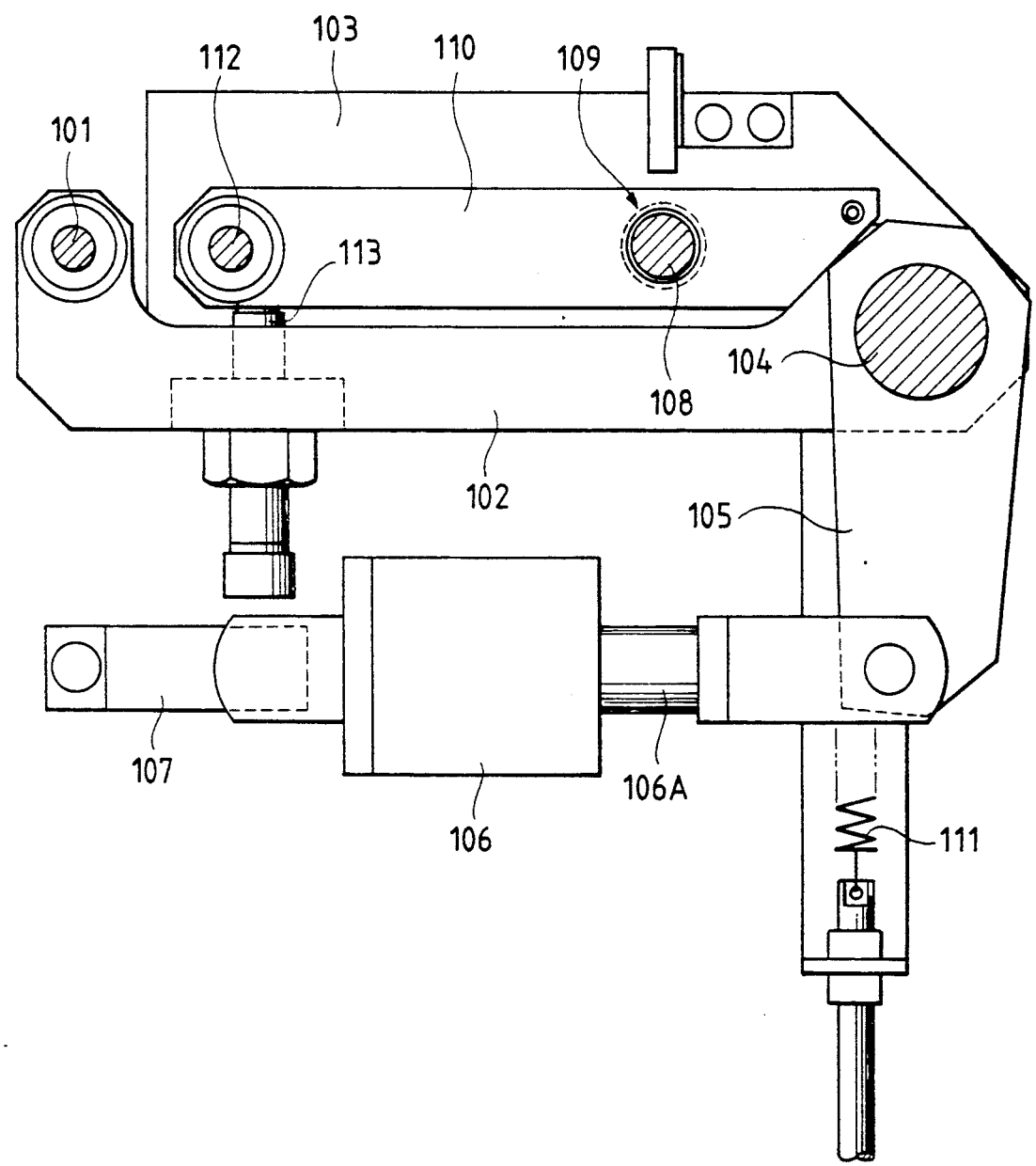
FIG. 2 is a cross-sectional view taken along the line 2—2 of FIG. 1.
Figure 3:
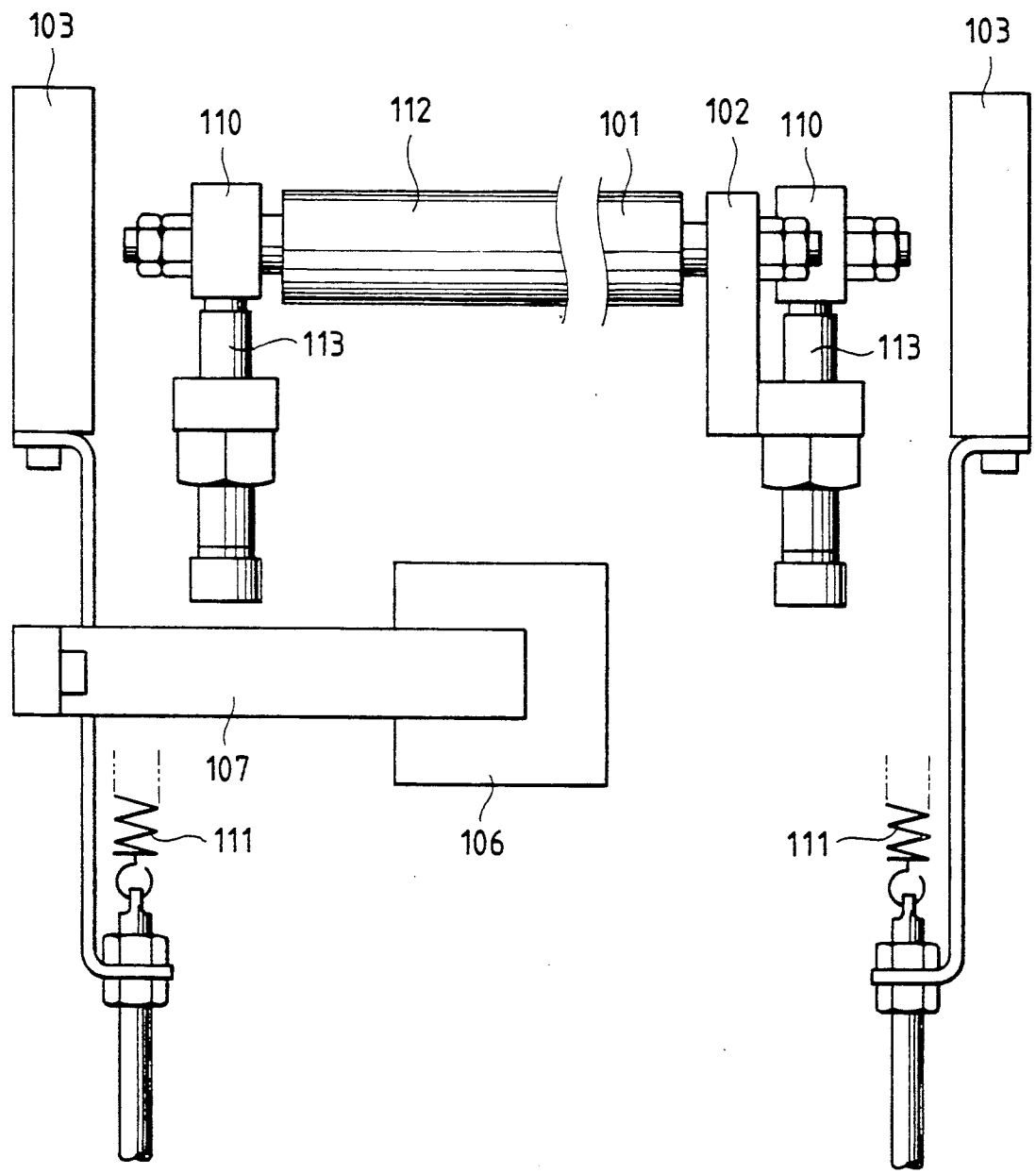
FIG. 3 is a front-elevational view as viewed in a direction P of FIG. 1.

One preferred embodiment of the invention will now specifically described with reference to the drawings.

In all the figures of the drawings, those parts performing the same functions are denoted by the same reference numerals, respectively, and a repetition of explanation of the similar parts will be omitted.

Figure 4:
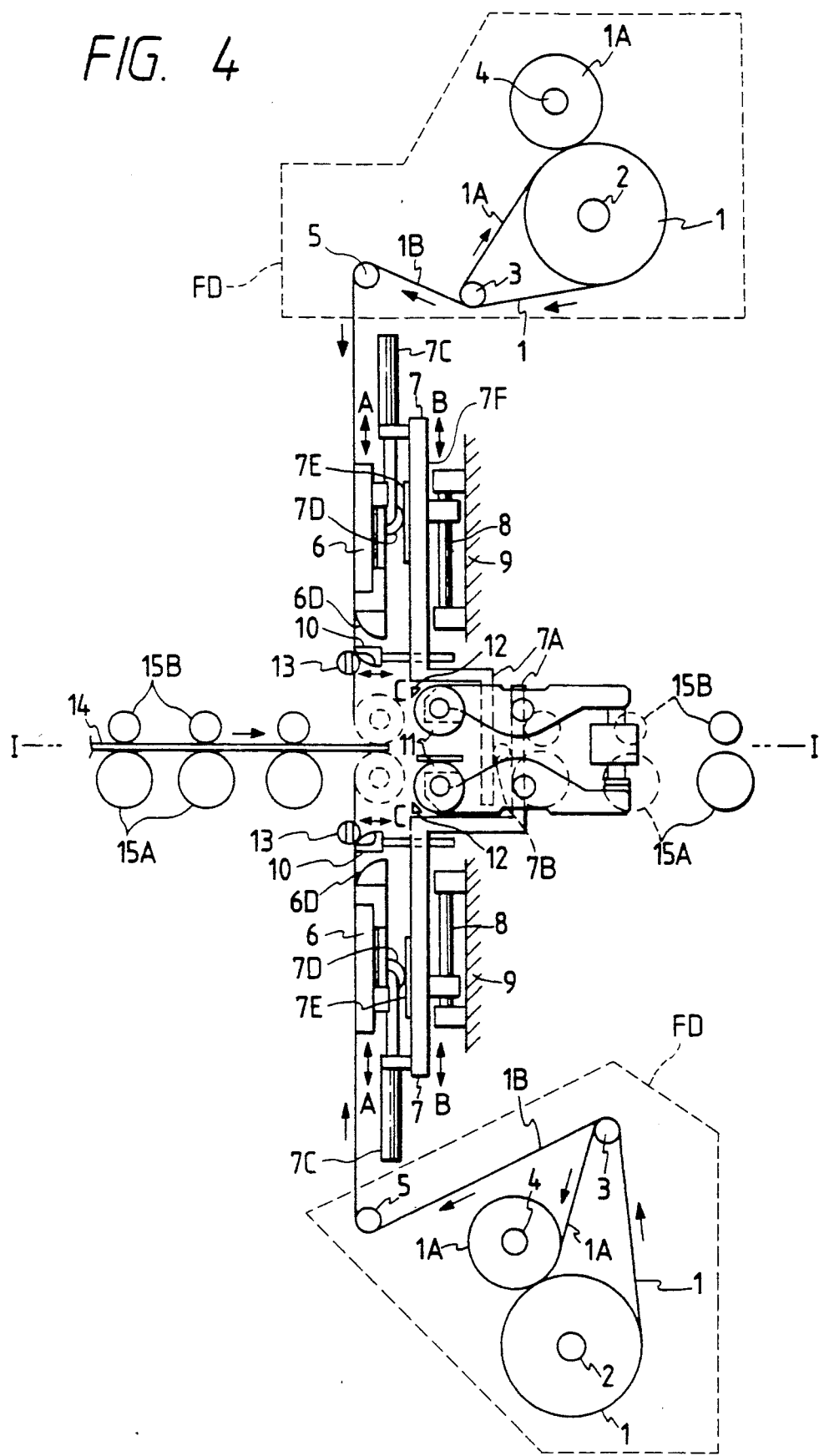
FIG. 4 is a schematic view showing the overall construction of a film bonding apparatus of the present invention.
Figure 10:
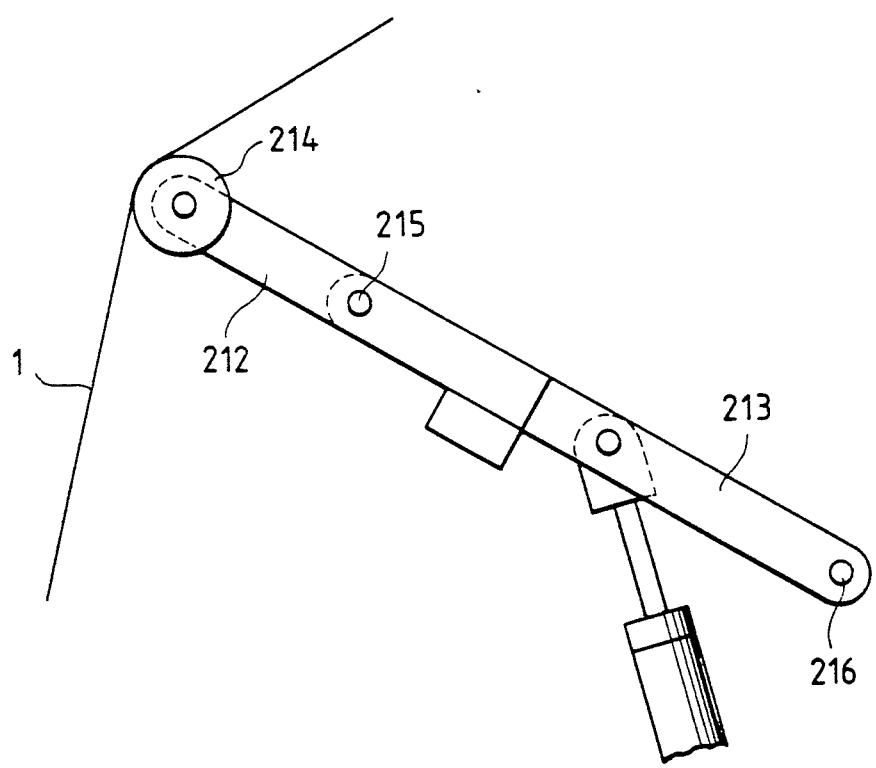
FIG. 10 is a view used to point out the problems of the conventional film bonding apparatus.

FIG. 4 schematically shows a basic construction of a film bonding apparatus of the invention for thermocompression-laminating (i.e., laminating under heat and pressure) a laminate film, composed of a photosensitive resin layer and light-permeable resin films, onto both the front and back sides of a printed wiring board.

As shown in FIG. 4, the film bonding apparatus of this embodiment comprises supply rollers 2 each having the laminate film 1 continuously wound therearound, the laminate film 1 being composed of three layers (i.e., a light-permeable resin film, a photosensitive resin layer and a light-permeable resin film). The laminate film 1 on each supply roller 2 is separated by a film separating roller 3. One of the light-permeable resin film layers 1A (protective film) is separated from the laminate film 1B which is now composed of the other light-permeable resin film layer and the exposed photosensitive resin layer.

The light-permeable resin film 1A thus separated is taken up by a take-up roller 4. The pair of supply rollers 2 as well as the pair of take-up rollers 4 are arranged respectively on the upper and lower sides of a board travel path I—I, and spaced equidistantly from the board travel path I—I.

The leading end of the separated laminate film 1B is fed to a main vacuum plate (film feed member) 6 via a tension roller 5.

The main vacuum plate 6 is movable toward and away from a film bonding position as indicated by a double-head arrow A. More specifically, the main vacuum plate 6 is mounted on a support member 7. The support member 7 is slidably mounted on guide rails 8 which are mounted on the body 9 of the apparatus (i.e., the frame of the film bonding apparatus). The pair of support members 7 are arranged respectively on the upper and lower sides of the board travel path I—I and spaced equidistantly from the board travel path I—I. The upper and lower support members 7 are movable toward and away from each other by a rack-and-pinion mechanism which comprises a pinion 7B in mesh with the racks 7A. The drive source 7C may be comprised of, for example, an air cylinder. The main vacuum plate 6 is moved by a drive source 7C and mounted on the support member 7. Also, a second rack-and-pinion mechanism is connected to the drive source. This second rack-and-pinion mechanism comprises a pinion 7D connected to a shaft of the drive source 7C, a rack 7E mounted on the support member 7, and a rack 7F mounted on the side of the main vacuum plate 6 that is not in contact with the laminate film 1B. Thus, the main vacuum plates 6 can move in the directions of the arrow A independently of each other.

A forward end portion 6D of the main vacuum plate 6 disposed close to the film bonding position has a film suction surface of an arcuate shape, and a plurality of film suction apertures on the suction surface. Against the resiliency of the laminate film 1B, the leading end of the laminate film 1B in the direction of feed thereof can be held on the arcuate surface of the forward end portion 6D by suction. The leading end of the laminate film 1B, held on the forward end portion 6D by suction, is moved into the film bonding position by the movement of the main vacuum plate 6 in the direction of arrow A toward the board 14.

In the vicinity of the path of feed of the laminate film 1B, a film leading end-holding member 10 is provided between the main vacuum plate 6 and the film bonding position. The pair of film leading end-holding members 10 are arranged respectively on the upper and lower sides of the board travel path I—I and spaced equidistantly from the board travel path I—I.

The film leading end-holding member 10 is designed to hold the cut portion of the laminate film 1B and also to enable the forward end portion 6D of the main vacuum plate 6 to suction-hold a fresh leading end of the laminate film 1B from which the preceding length of the film has been cut More specifically, the film leading end-holding member 10 is movable toward and away from the path of feed of the laminate film 1B as indicated by a double-head arrow C.

The film leading end-holding member 10 is also designed to hold the trailing end of the cut segment of the laminate film 1B when the laminate film 1B is cut at the cutting position. A fixed blade of a rotary cutter 13 is mounted on the film leading end holding member 10. The rotary cutter 13 is moved, together with the film leading end holding member 10, toward and away from the laminate film 1B on the back side of the laminate film 1B. A rotary blade of the rotary cutter 13 is mounted on the support member 7 and is movable toward and away from the laminate film 1B on the front side of the laminate film 1B.

Thermocompression bonding rollers 11 are continuously rotated so as to prevent temperature spots from developing on their surfaces. Each of these rollers 11 is movable between its retracted position indicated by a solid line (FIG. 4) and its film bonding position indicated by a broken line. The thermocompression bonding rollers 11 are movable toward the leading end of the laminate film 1B held in the film bonding position. The rotation of the thermocompression rollers 11 automatically feeds and bonds the laminate film 1B to the film-bonding surface of a printed wiring board 14. The thermocompression rollers 11 start at the leading end of the laminate film 1B and move towards the trailing end over a predetermined distance in the direction of travel of the board 14 while bonding the laminate film 1B onto the board 14. The thermocompression bonding rollers 11 are moved in a direction opposite to the board travel direction, thereby preventing the laminate film 1B from being slack.

Each of vacuum bars 12 serves to hold by suction the trailing end of the laminate film 1B to be laminated under heat and pressure by the thermocompression bonding rollers 11, thereby applying an appropriate tension to the laminate film 1B so that the laminate film 1B will not have wrinkles and the like. The vacuum bar 12 is moveable with and in spaced relation to the periphery of thermocompression bonding roller 11. The pair of thermocompression bonding rollers 11 as well as the pair of vacuum bars 12 are arranged respectively on the upper and lower sides of the board travel path I—I and spaced equidistantly from the board travel path I—I.

The printed wiring boards 14 are conveyed along the board travel path I—I by a board conveying mechanism mounted within or on the film bonding apparatus. More specifically, the board conveying mechanism is designed to convey each board 14 to the film bonding position, and transfer the board 14 from the film bonding position to the next stage (exposure device) after the laminate film 1B is bonded to the board 14 under heat and pressure. The board conveying mechanism mainly comprises drive rollers 15A and driven rollers 15B.

The film guide device for film bonding in this embodiment is applied to a film supply mechanism FD surrounded by a broken line in FIG. 4. As shown in FIG. 1, a movable guide roller 101 (corresponding to the tension roller 5 in FIG. 4) for supporting and guiding the laminate film 1B is supported at its opposite ends by one of the ends of the movable guide roller support arms 102. The other ends of the movable guide roller support arms 102 are fixedly secured to a rotation-transmitting bar 104 rotatably mounted on support members (mounting metal members for mounting on the apparatus body) 103. A crank 105 is mounted at one end on the rotation-transmitting bar 104, and a movable member 106A of a cylinder 106 (e.g. air cylinder) is pivotally connected to the other end of the crank 105. The cylinder 106 is mounted on the apparatus body through a cylinder bracket 107.

As shown in FIG. 1, a tape 101A having an appropriate frictional resistance is wound around the outer surface of the movable guide roller 101 so as to stretch the laminate film 1B widthwise thereby preventing longitudinal wrinkles from developing in the laminate film 1B. The tape 101A also serves to always keep the speeds of supply of the opposite ends of the laminate film 1 equal to each other. More specifically, the speeds of supply of the opposite ends of the laminate film 1 wound on the supply roller 2 may be slightly different from each other due to the condition of winding of the laminate film. The tape 101A compensates for this. Therefore, the tape 101A is wound either entirely or partially on the surface of the movable guide roller 101 to create the desired effect.

Opposite ends of a separating roller 108 (corresponding to the film separating roller 3) are rotatably mounted respectively on the support members 103 through bearings 109.

The separating roller 108 serves to separate from the laminate film 1 one of the light-permeable resin film layers (protective film) 1A. The separated laminate film 1B is composed of the photosensitive resin layer (one surface of which is exposed) and a light-permeable resin film layer. The opposite end portions of the separating roller 108 are mounted respectively on intermediate portions of swing roller support arms 110. One end of each swing roller support arm 110 is pulled by a spring 111 at a position near the rotation-transmitting bar 104 for the movable guide roller support arm 102 Furthermore, the swing roller support arm 110 is rotatable about the bearing 109 together with the separating roller 108. Opposite ends of a swing roller 112 are supported by the other ends of the swing roller support arms 110, respectively. A swing roller stopper 113 is provided at a position near that portion of the swing roller 112 supported by the swing roller support arm 110.

Next, a bonding process (thermocompression laminating) performed by the use of the film guide device for film bonding in this embodiment will now be briefly described with reference to FIGS. 5 through 9, which schematically show the function of the apparatus at various steps of the bonding operation.

First, as shown in FIG. 5, the leading end of the laminate film 1B, previously separated by the separate roller 108, is manually positioned at the film leading end-holding member 10.

Then, a film suction surface 10D of the film leading end-holding member 10 holds the leading end of the laminate film 1B by suction.

At this time, the movable guide roller support arms 102 are inclined downward in a left direction due to the extending of the movable member 106A from the cylinder 106. As a result, the movable guide roller 101 is moved downward from a horizontal position. The swing roller support arms 110 are also inclined downward in a left direction by the tension of the laminate film 1B, so that the swing roller 112 is moved downward from a horizontal position.

Thereafter, the film leading end-holding member 10 is moved in the direction of arrow C by the drive source shown in FIG. 4 to move the leading end of the laminate film 1B away from the path of travel of the laminate film 1B, so that this leading end is held by the forward end 6D of the main vacuum plate 6 by suction.

When the operation is carried out continuously, the leading end of the laminate film 1B cut by the rotary cutter 13 is held by the forward end 6D of the main vacuum plate 6.

Then, the leading end of the printed wiring board 14, which is transferred along the board travel path I—I by the drive rollers 15A and driven rollers 15B of the board conveying mechanism, is caused to stop at the film bonding position. This stop is effected by detecting the leading end of the board 14 by a sensor and by stopping the drive rollers 15A of the board conveying mechanism in response to this detection signal. The board 14 conveyed by the board conveying mechanism is caused to pass between the two film leading end-holding members 10 disposed on the upper and lower sides of the board travel path I—I and spaced equidistantly from the board travel path I—I.

Then, as shown in FIG. 6, the main vacuum plate 6 and its forward end portion 6D are moved in the direction of arrow A toward the surface of the leading end of the board 14, stopped at the film bonding position, thereby moving the leading end of the laminate film 1B to the film bonding position. Then, the forward end portion 6D is abutted against the film bonding surface of the leading end of the board 14.

Simultaneously, the movable guide roller support arms 102 are moved to the horizontal position due to the retraction of the movable member 106A into the cylinder 106. As a result, the movable guide roller 101 is disposed horizontally, and the laminate film 1B is moved into a position or plane which is the same as the plane of the suction surface of the main vacuum plate 6. The swing roller arms 110 are also brought into the horizontal position by the movable guide roller 101 and place a tension on the laminate film 1B. Also, the swing roller 112 lies substantially flush with the movable guide roller 101, that is, disposed substantially horizontally.

Thus, during initial bonding, the position of the movable guide roller 101 causes the laminate film 1B to be disposed in the same plane as the suction surface of the main vacuum plate 6. As a result, the tension is applied to the laminate film 1B only in a vertical direction during the feeding of the laminate film 1B. Therefore, when initially bonding the leading end of the laminate film 1B, the displacement of the laminate film 1B out of position is prevented. In addition, longitudinal wrinkles are prevented from developing in the laminate film 1B.

Then, as shown in FIG. 7, the suction-holding of the laminate film 1B by the main vacuum plate 6 and its forward end portion 6D is released. Also, the main vacuum plate 6 and its forward end portion 6D are moved away from the film bonding position.

Simultaneously, the movable guide roller support arms 102 are disposed horizontally due to the retraction of the movable member 106A into the cylinder 106. As a result, the movable guide roller 101 is moved into the horizontal position. Even though the movable guide roller support arms 102 are disposed horizontally, the swing roller arms 110 are inclined in the left direction from the horizontal position, because the tension of the laminate film 1B becomes weak, and the swing roller 112 is moved to a position above the movable guide roller 101.

Thus, because of the position of the swing roller arms 110, even when the suction-holding of the laminate film 1B by the main vacuum plate 6 and its forward end portion 6D is released, the laminate film 1B being fed is prevented from becoming slack. Therefore, when bonding the laminate film 1B onto the board 14, the laminate film 1B is prevented from having longitudinal wrinkles.

Then, as shown in FIG. 8, after the main vacuum plate 6 and its forward end portion 6D are moved away from the film bonding position, the thermocompression bonding rollers 11 are moved toward the film bonding position to be held against the leading ends of the respective laminate films 1B under an appropriate pressure. The printed wiring board 14 is moved in the direction of arrow E by the rotation of the thermocompression bonding rollers 11, thereby initiating the thermocompression laminating.

At this time, as in FIG. 6, the swing roller 112 lies substantially flush with the movable guide roller 101 by the tension of the laminate film 1B, that is, disposed substantially horizontally.

Then, as shown in FIG. 9, while the laminate film 1B is automatically fed by the rotation of the thermocompression bonding roller 11, the laminate film 1B is bonded to the film bonding surface of the board 14 over a predetermined distance or the length from the leading end to training end of the board 14.

During the time when the thermocompression roller 11 and the board 14 are moved in the board travel direction while bonding the laminate film 1B to the board 14, the laminate film 1B is fed from the supply roller 2 by these movements.

When a sensor provided at the board travel path detects the arrival of the trailing end of the board 14 at a predetermined position of the board conveying device, the following operations occur in response to this detection signal.

(a) The film leading end-holding member 10 is moved toward the laminate film 1B, where the main vacuum plate 6 and the film leading end-holding member 10 hold the laminate film 1B by suction. In this case, the length of the laminate film 1B extending between the distal end of the fixed blade (disposed in the vicinity of the film leading end-holding member 10) and the point of pressure contact of the two thermocompression bonding rollers 11 with the laminate film 1B is approximately equal to the length of that portion of the film bonding surface of the board 14 to which the laminate film 1B has not yet been bonded.

(b) In synchronism with the suction-holding of the laminate film 1B by the holding member 10 for cutting purposes, the thermocompressing bonding roller 11 and the board 14 are moved a predetermined distance in the direction opposite to the direction of travel of the board 14. Because of the suction-holding by the cutting-purpose holding member 10 and the movement of the thermocompression bonding roller 11, the portion of the laminate film 1B extending between the film leading end-holding member 10 and the thermocompression bonding becomes slack. A jet of air is applied in a direction of arrow F (FIG. 9) to direct this slack portion in the board travel direction.

Next, the slackening of the laminate film 1B as shown in FIG. 9 will now be described.

First, a braking force is applied to stop the rotation of the supply roll 2 so as to stop the supply of the laminate film 1B from the supply roll 2, and the laminate film 1B is held on the main vacuum plate 6 by suction. This causes the main vacuum plate 6 to be rapidly driven toward the board 14. The movement of the main vacuum plate 6 is synchronized with the extending of the movable member 106A from the cylinder 106 to incline the movable guide roller support arms 102 downwardly in the left direction. Simultaneously, the amount of displacement of the movable guide roller 101 is designed to be equal to the amount of slackening of the laminate film 1B (the amount of movement of the main vacuum plate 6).

As will be appreciated from the foregoing, in this embodiment, the movable guide roller 101 is provided so that when initially bonding the laminate film, the laminate film 1B can be always disposed at the same plane as the suction surface of the main vacuum plate 6. With this arrangement, only vertical tension is applied to the laminate film 1B while being fed. Therefore, when initially bonding the leading end of the laminate film 1B, the laminate film 1B is prevented from being displaced out of position. In addition, the laminate film 1B is prevented from having longitudinal wrinkles.

Because of the provision of the swing roller support arms 110, even when the suction-holding of the laminate film 1B by the main vacuum plate 6 and its forward end portion 6D is released, the slackening of the laminate film 1B being fed is prevented. Therefore, when bonding the laminate film 1B to the printed wiring board 14, the laminate film 1B is prevented from having longitudinal wrinkles.

The braking of the rotation of the supply roller 2, the rapid driving of the main vacuum plate 6 toward the board 14 and the extending of the movable member 106A from the cylinder 106 to incline the movable guide roller support arm 102 are all synchronized with one another. As a result, the laminate film 1B is slackened. Even if a strong braking force is applied to prevent the laminate film 1B from being excessively fed from the supply roll 2 upon rotation of the supply roll by inertia when the main vacuum plate 6 is rapidly moved toward the board 14 to rapidly feed the laminate film 1B an excessive tension is not applied to the laminate film 1B being fed. Therefore, the laminate film 1B is prevented from being extended and having longitudinal wrinkles.

In the above embodiment, although the upper and lower film supply mechanisms FD are of the same construction, the lower film supply mechanism FD may be constituted only by the movable guide roller without the use of the swing roller. The reason for this is that the laminate film is not slackened by its own weight of the lower side.

While the present invention has been specifically described by way of the embodiment thereof, the invention itself is not to be restricted to the above embodiment, and various modifications can be made without departing the scope of the invention.

We claim:

1. A film guide device for a film bonding apparatus operative to bond a continuous film transferred from a supply position to a bonding position comprising:
   a movable guide roller having opposite ends and operative for supporting and guiding the film;
   movable guide roller support arms having first and second ends, said first end being supportingly engaged with said opposite ends of said movable guide roller;
   a rotation-transmitting member having first and second ends, said second end of said movable guide roller support arms being fixedly secured to said first end of said member;
   support members rotatably supporting said second end of said rotation-transmitting member;
   a rotation-drive source, connected to said rotation transmitting member, being operative to cause tension adjusting movement of said movable guide roller;
   swing roller support arms supported by said support members; and
   a swing roller supported by said swing roller support arms.

2. A film guide device for film bonding according to claim 1, further comprising:
   a separating roller having opposite ends, said ends being held respectively by said support members;
   said swing roller support arms having first and second ends, said swing roller support arms being mounted on said separating roller proximate the ends of said separating roller at an intermediate position along said swing roller support arms, said first end of said swing roller support arms is rotatably supported by said support member in the vicinity of said rotation-transmitting member;
   a spring attached to provide a force to said swing roller support arms in the vicinity of said rotation-transmitting member.

3. A film guide device for film bonding according to claim 2, further comprising:
   a swing roller stopper provided to stop movement of that portion of said swing roller supported by said swing roller support arm.

4. A film guide device for film bonding according to claim 1 further comprising means for applying a tension to the film, fed to said movable guide roller, in the direction of the width of said film.

5. A film guide device for film bonding according to claim 1, further comprising means to synchronize the stopping of said film from being fed, the movement of said film towards a bonding surface, and the action of said rotation-drive source.

6. A film guide device for film bonding according to claim 1, wherein a tape having an appropriate frictional resistance is wound around the outer surface of said movable guide roller.

7. A film guide device for film bonding according to claim 1, wherein said movable guide roller is disposed so as not to apply tension to said film before a leading end of said film is initially attached to said bonding position, and said swing roller is moved by tension of said film.

8. A film guide device for film bonding according to claim 1, wherein said movable guide roller is moved so as to apply tension to said film and to cause said film to be disposed in the same plane as holding surface of a film holding member when a leading end of said film is initially bonded to said bonding position, and said swing roller is moved by the movement of said movable guide roller and tension of said film.

9. A film guide device for film bonding according to claim 1, wherein said swing roller is moved by a spring so as to push and prevent said film from becoming slack when a leading end of said film is released from a film holding member.

10. A film guide device for film bonding according to claim 1, wherein said swing roller is moved by tension of said film so as to lie substantially flush with said movable guide roller when bonding is initiated.

11. A film guide device for film bonding according to claim 1, wherein said movable guide roller is moved in synchronism with rapid supply of said film and rapid driving of a film holding member so as to loosen said film when a trailing end of said film is cut.

12. The film guide device of claim 1, wherein said rotation-drive source shifts said movable guide roller from a first position during a first stage of operation to a second position during a second stage of operation.

13. The film guide of claim 1, wherein said rotation-drive source, shifts said movable guide roller independently of an amount of tension in the film.

14. A film guide device for film bonding according to claim 1, wherein said swing roller is moved by tension of said film and said movable guide roller is moved independent of tension of said film.

15. A film guide device for film bonding according to claim 1, wherein said rotation-drive source operates independently of tension in said film.

* * * * *